(12) United States Patent
Stark et al.

(10) Patent No.: US 10,976,576 B2
(45) Date of Patent: Apr. 13, 2021

(54) BIAS CONTROL FOR DOWNHOLE OPTICAL INTENSITY MODULATORS

(71) Applicant: Halliburton Energy Services, Inc., Houston, TX (US)

(72) Inventors: Daniel Joshua Stark, Houston, TX (US); Aaron Michael Fisher, Kingwood, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 232 days.

(21) Appl. No.: 16/305,523

(22) PCT Filed: Aug. 30, 2016

(86) PCT No.: PCT/US2016/049500
§ 371 (c)(1),
(2) Date: Nov. 29, 2018

(87) PCT Pub. No.: WO2018/044277
PCT Pub. Date: Mar. 8, 2018

(65) Prior Publication Data
US 2020/0393705 A1 Dec. 17, 2020

(51) Int. Cl.
*G02F 1/01* (2006.01)
*G01R 23/20* (2006.01)
(Continued)

(52) U.S. Cl.
CPC .......... *G02F 1/0123* (2013.01); *E21B 47/135* (2020.05); *G01R 23/20* (2013.01); *G02F 1/225* (2013.01); *G02F 2001/212* (2013.01)

(58) Field of Classification Search
CPC .. G02F 1/0123; G02F 1/225; G02F 2001/212; E21B 47/135; G01R 23/20
See application file for complete search history.

(56) References Cited

U.S. PATENT DOCUMENTS 3,844,752 A * 10/1974 Kaiser ................... C03B 23/207
65/393
4,820,016 A * 4/1989 Cohen ................ G01K 11/3213
359/241
(Continued)

FOREIGN PATENT DOCUMENTS

WO   WO 2015/015533 A1   2/2015

OTHER PUBLICATIONS

Cui et al. "Suppression of Second-Order Harmonic Distortion in ROF Links Utilizing Dual-Output MZM and Balanced Detection." *Microwave Photonics (MWP), 2012 International Topical Meeting.* Sep. 11-14, 2012.
(Continued)

*Primary Examiner* — Andrew Jordan
(74) *Attorney, Agent, or Firm* — Haynes and Boone, LLP

(57) ABSTRACT

Example embodiments are described for a method and system for direct current (DC) bias control in downhole optical intensity modulators. After receiving an optical signal from a downhole intensity modulator, a harmonic distortion analysis is performed on the optical signal to determine whether a power spectrum of the optical signal deviates by a preselected amount from an expected power spectrum. The expected power spectrum occurs when a bias point is positioned at a quadrature point of a sinusoid associated with the optical signal. A DC bias voltage of the intensity modulator is subsequently adjusted in response to the harmonic distortion analysis.

20 Claims, 10 Drawing Sheets

(51) Int. Cl.
    *G02F 1/225* (2006.01)
    *E21B 47/135* (2012.01)
    *G02F 1/21* (2006.01)

(56) References Cited

U.S. PATENT DOCUMENTS

| | | | |
|---|---|---|---|
| 5,003,624 | A | 3/1991 | Terbrack et al. |
| 5,161,044 | A | 11/1992 | Nazarathy et al. |
| 5,208,817 | A | 5/1993 | Kao et al. |
| 5,343,324 | A | 8/1994 | Le et al. |
| 5,351,325 | A * | 9/1994 | Miller .................. G02B 6/2856 385/24 |
| 5,532,867 | A | 7/1996 | Hayes et al. |
| 5,644,665 | A | 7/1997 | Burns et al. |
| 6,580,544 | B1 | 6/2003 | Lin et al. |
| 7,184,671 | B2 | 2/2007 | Wang |
| 7,394,992 | B2 * | 7/2008 | Kimmitt ............... G02F 1/0123 398/185 |
| 8,160,456 | B2 | 4/2012 | Smith et al. |
| 8,184,991 | B2 | 5/2012 | Farina et al. |
| 9,001,407 | B2 | 4/2015 | Li et al. |
| 9,195,000 | B2 * | 11/2015 | Fini .................... G02B 6/02042 |
| 2003/0175037 | A1 * | 9/2003 | Kimmitt ............... G02F 1/0123 398/198 |
| 2007/0021087 | A1 | 1/2007 | Turner |

OTHER PUBLICATIONS

International Search Report and the Written Opinion of the International Search Authority, or the Declaration, dated May 26, 2017, PCT/US2016/048930, 16 pages, ISA/KR.

Salvestrini et al. "Analysis and Control of the DC Drift in LiNbO$_3$-Based Mach—Zehnder Modulators." *Journal of Lightwave Technology*. vol. 29, Issue 10. May 2011.

Sotoodeh et al. "Modulator Bias and Optical Power Control of Optical Complex E-Field Modulators." *Journal of Lightwave Technology*. vol. 29, Issue 15. Aug. 2011.

Svarny. "Bias Driver of the Mach-Zehnder Intensity Electro-Optic Modulator, Based on Harmonic Analysis." *Advances in Robotics, Mechatronics and Circuits, Structural Analysis*. 2014.

\* cited by examiner

BIAS CONTROL FOR DOWNHOLE OPTICAL INTENSITY MODULATORS

PRIORITY

The present application is a U.S. National Stage patent application of International Patent Application No. PCT/US2016/049500, filed on Aug. 30, 2016, the benefit of which is claimed and the disclosure of which is incorporated herein by reference in its entirety.

BACKGROUND

In telemetry systems, optical intensity modulators are often used to encode data onto an optical signal. In some examples, Mach-Zehnder (MZ) modulators can be used to modulate the optical signal by splitting the incoming optical signal into one or more waveguide arms of the MZ modulator using conducting electrodes. Voltage applied to each waveguide arm causes the optical signal in each arm to be phase modulated, with the electric field generated by the applied voltages inducing a change in the refractive index of each waveguide arm. Different refractive indexes result in different propagation speeds of the optical signal through each branch, thereby causing a phase change in the optical signal propagating through each branch. The phase modulation is then converted to intensity modulation by interferometrically combining the two optical signals having different phase modulations.

The overall transfer characteristic of the MZ modulator is approximately sinusoidal, with the most linear modulation being achieved in and around the quadrature point (also known as the "quadrature"), namely the point where there is a 90° phase relationship between light traveling through the waveguides of the MZ modulator. The bias point (also known as the operating point) of the MZ modulator is typically set at the quadrature. However, due to the nature of the interferometric principles on which the MZ modulator are based, fiber optics telemetry systems using MZ modulators have a direct current (DC) bias that tends to drift, for example over time or with changes in temperature. Downhole optical modulators can be exposed to harsh downhole environments for extended time durations, where temperatures can experience rapid increases and decreases. Drift in the DC bias can affect the linearity, and other properties such as the rise and fall times, of transmitted optical signal waveforms and lead to data errors or other transmission issues.

BRIEF DESCRIPTION OF THE DRAWINGS

Some embodiments are illustrated by way of example and not limitation in the figures of the accompanying drawings in which.

DETAILED DESCRIPTION

Figure 1A:
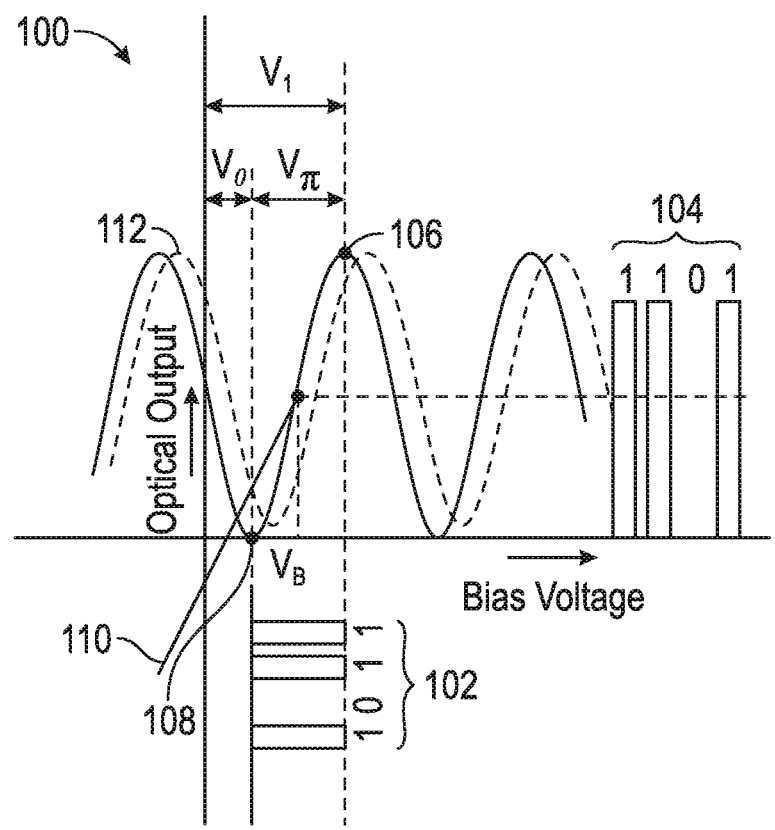
FIG. 1A is a modulator transfer chart illustrating the effect on signal output for a digital signal with proper direct current (DC) bias, according to one or more example embodiments.

The following detailed description refers to the accompanying drawings that depict various details of examples selected to show how aspects of this disclosure may be practiced. The discussion addresses various examples of the disclosed subject matter at least partially in reference to these drawings, and describes the depicted embodiments in sufficient detail to enable those skilled in the art to practice the subject matter disclosed herein. Many other embodiments may be utilized for practicing the disclosed subject matter other than the illustrative examples discussed herein, and structural and operational changes in addition to the alternatives specifically discussed herein may be made without departing from the scope of the disclosed subject matter.

Although fiber optics systems offer many advantages, fiber optics telemetry systems based on intensity modulation have a direct current (DC) bias that is dependent on temperature and can drift with time. Control of the DC bias and other signal parameters over a range of temperatures is important for the success of downhole fiber optic telemetry based upon intensity modulation to be able to reliably transmit data. With optical modulators potentially exposed to the harsh downhole environment for extended time durations, where temperatures can experience rapid increases and decreases and where the DC bias can drift with time at elevated temperatures, improved DC bias control would be beneficial for data transmission in optical fiber telemetry systems.

One or more example embodiments described below provide methods and systems for DC bias control in downhole optical intensity modulators. After receiving an optical signal from a downhole intensity modulator, a harmonic distortion analysis is performed on the optical signal to determine whether a power spectrum of the optical signal deviates by a preselected amount from an expected power spectrum. In at least one embodiment, the preselected amount might be any preselected amount. In at least one example, the power spectrum and the extent of linearity required can be used to decide whether to have the peak of the harmonic at a preselected amount lower than the fundamental transmission band (e.g., 3 dB, 10 dB, 20 dB, 30 dB, or the like). In another example the total power in all harmonics (or the first 3 harmonics, or only odd harmonics, or the like) can be compared to the power in the fundamental to determine that the total power of the harmonics should be at a preselected percentage of the fundamental (e.g., 1%, 10%, 0.1%, 50%, or the like) of the fundamental. In at least one example, the shape of the signal is known apriori and changes in the waveform can be identified. The expected power spectrum occurs when a bias point is positioned at a quadrature point of a sinusoid associated with the optical signal. In at least one embodiment, the signal can operate within the linear region of the modulator, which means the bias point can move around the quadrature point as long as the signal remains in the linear region. This can happen when the signals voltage is smaller than the linear region of the modulator. A DC bias voltage of the intensity modulator is subsequently adjusted in response to the harmonic distortion analysis. Implementations of the disclosed example embodiments can provide for a feedback mechanism to control for DC-bias drift in downhole environments, and in real-time using the original data signal from the downhole intensity modulator.

Although many of the examples are discussed with regard to DC bias control, in some examples, radio frequency (RF) signal control can be used to affect data transmission. In some embodiments, one or more features of the RF signal can be adjusted, for example, the offset or the amplitude of the RF signal.

FIG. 1A is a modulator transfer chart showing a transfer function 100 in the form of a sinusoidal curve that represents signal output from an optical intensity modulator (e.g., a Mach-Zehnder (MZ) modulator) for a digital signal with proper DC bias. In operation, the MZ modulator superimposes an electrical data signal 102 onto a light carrier signal (not shown) to produce an optical output signal 104 to carry the data. The vertical axis of transfer function 100 corresponds to the MZ modulator optical output and the horizontal axis corresponds to the bias voltage. The bias voltage changes the optical phase difference between interfering waves at the output of the MZ modulator, which determines whether the waves will interfere constructively or destructively at the output, and thus controls the output intensity (e.g., amplitude). It is noted that the terms amplitude modulator and intensity modulator refer to the same structure and are used interchangeably throughout this description.

FIG. 1A shows a bias voltage difference $V_\pi$ between a peak 106 and a null 108 of the transfer function 100. A logic one (i.e., bit value "1") can be represented by the maximum of the modulator (or any value above a predetermined upper threshold level) output at peak 106. A logic zero (i.e., bit value "0") can be represented by the minimum of the modulator (or any value below a predetermined lower threshold level) output at null 108. In at least one example, the upper threshold level and the lower threshold level are the same. The bias voltage (e.g., the horizontal axis) changes the optical phase difference between interfering waves at the output of the MZ modulator, and thus changes the output intensity. The peaks (e.g., peak 106) of the transfer function 100 occur when the phase difference is an integer multiple of 360 degrees (due to constructive interference), and the nulls (e.g., null 108) occur when the phase difference is an odd-integer multiple of 180 degrees (due destructive interference). The bias voltage difference $V_\pi$ can be defined as the change in bias voltage necessary to move between the peak 106 and the null 108 on the transfer function 100 curve, and thus is the driving voltage that induces a change between the logic one and logic zero of the optical output.

The position at which the electrical data signal 102 is applied to the transfer function 100 is controlled by a DC bias voltage $V_0$ (also simply referred to as "bias voltage"). For the optical output signal to have the greatest ratio between maximum and minimum power outputs, otherwise known as the extinction coefficient, the MZ modulator should be biased such that the electrical data signal 102 should be applied at a quadrature point 110 (i.e., at an inflection point of transfer function 100). Quadrature points occur when the optical phase difference between interfering waves at the output of the MZ modulator is an odd-integer multiple of 90 degrees, and are at voltages that are halfway between a maximum transmission point (e.g., peak 106) and a minimum transmission point (e.g., null 108) on the transfer function 100 curve.

When the DC bias voltage $V_0$ is such that a bias point $V_B$ (i.e., the operating point) is positioned, and therefore the input electrical data signal 102 is applied, at the quadrature point 110, as illustrated in FIG. 1A, the transfer function 100 varies evenly around the quadrature point 106 with an amplitude having peak-to-peak voltage $V_{pp}=V_\pi$. This results in the output optical signal 104 having a maximal extinction ratio (i.e., ratio of powers between the logic one and zero bits), and therefore reduces bit-error rates in the output optical signal 104.

Ideally, the desired bias point $V_B$ would occur at a specific DC bias voltage that remains constant for all time despite variations in environmental conditions. However, due to the nature of pyroelectric, photorefractive, and photoconductive effects in the MZ modulator's electro-optic material (often lithium niobate [LiNbO$_3$], a semiconductor-like gallium arsenide [GaAs], or an electro-optic polymer), the transfer function tends to drift to the left or right with changes in wavelength and/or environmental temperature changes, and/or as a result of aging, as illustrated by the dotted transfer curve bold curve 112.

Figure 1B:
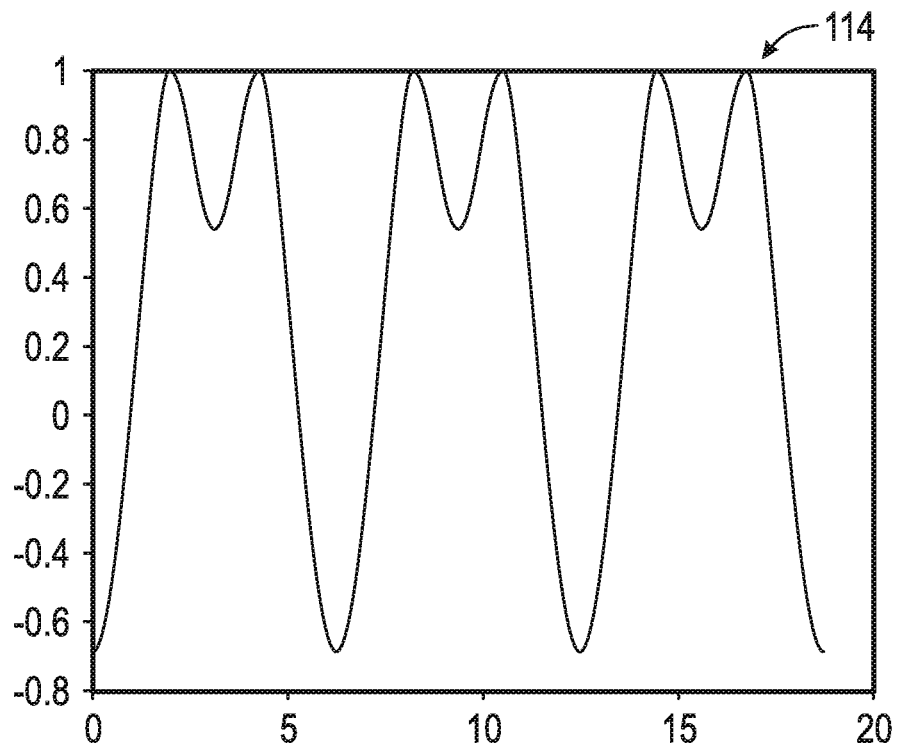
FIG. 1B is an exemplary time series output signal illustrating the effect on signal output for an analog pure sinewave signal with improper DC bias, according to one or more example embodiments.

As the DC bias $V_0$ drifts (due to being temperature and temporally dependent), the extinction ratio of the output optical signal 104 will decrease in a non-linear fashion. In some instances, this can result in poor output signal quality because the input data signal 102 is no longer being applied at the quadrature point 106, which can increase bit-error rates. In other instances, such as when the signal is analog, drift in the DC bias $V_0$ can even affect the shape of a transmitted waveform. For example, FIG. 1B is a modulator transfer chart showing a waveform 114 illustrating the effect on signal output for an analog signal with improper DC bias. As illustrated, the waveform 114 represents a distortion in the output signal from a MZ intensity modulator in which the DC bias $V_0$ is not equal to the quadrature point, which causes the resulting waveform 114 to significantly deviate from a pure sine wave. Thus, DC bias drift can lead to significant increases in the bit error rate, especially in high bandwidth telemetry system where DC bias drift can preclude good data fidelity. As a result, the tendency of MZ modulators to drift typically necessitates some type of bias control to return the bias point $V_B$ back to or near a quadrature point.

Figure 2A:
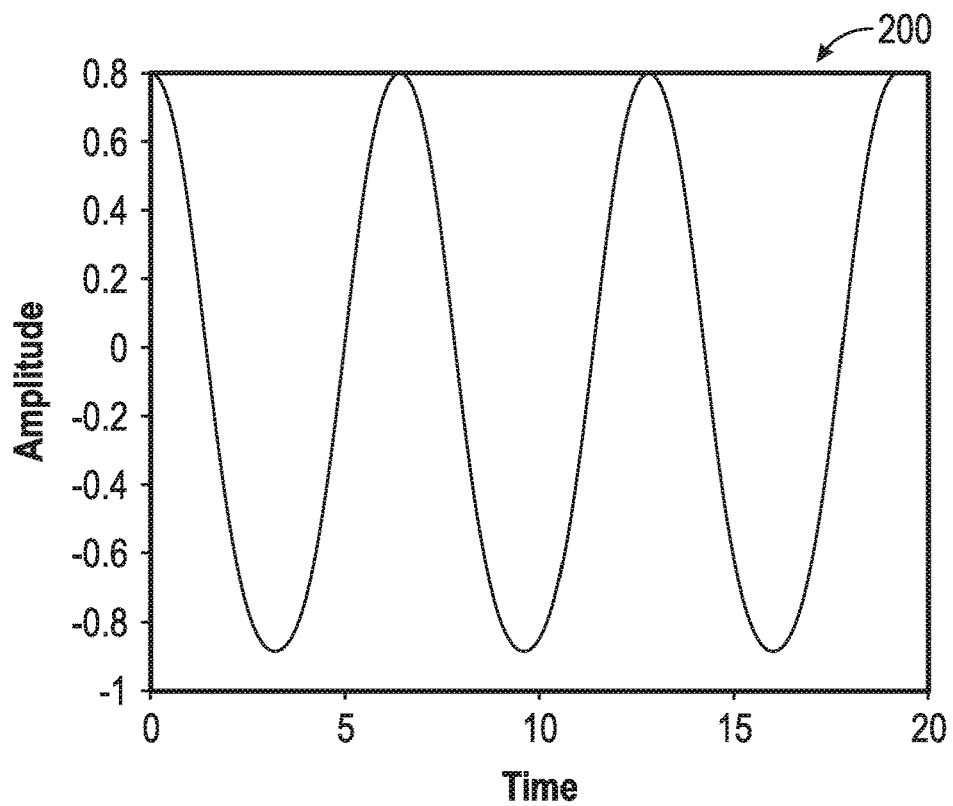
FIG. 2A is a plot diagram illustrating a sinusoidal curve that represents signal output for an analog signal with proper DC bias selection, according to one or more example embodiments.
Figure 2B:
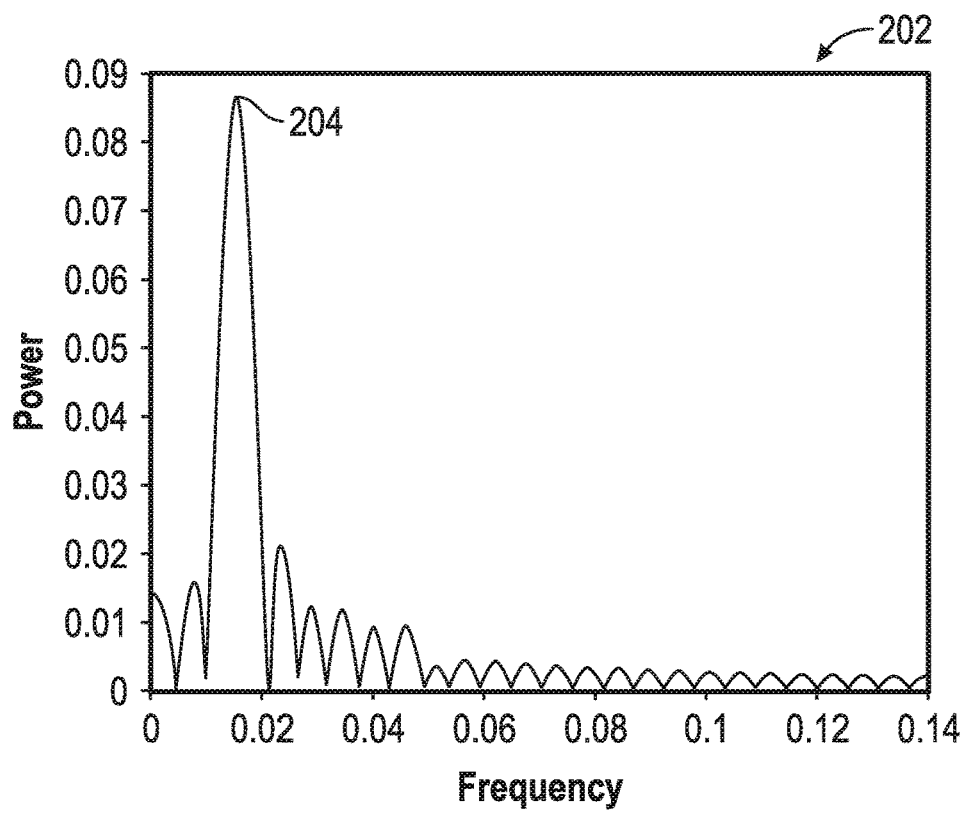
FIG. 2B is a plot diagram illustrating a power spectrum resulting from Fourier transforming an analog signal with proper DC bias selection, according to one or more example embodiments.

FIG. 2A is a plot diagram illustrating a sinusoidal curve 200 that represents signal output from an optical intensity modulator (e.g., a MZ modulator) for an analog signal with proper DC bias selection. As shown, the sinusoidal curve 200 plots amplitude as a function of time. The vertical axis of the plot corresponds to amplitude of the MZ modulator optical output and the horizontal axis corresponds to an arbitrary unit of time. A Fourier transform can be applied to the optical signal output from the MZ modulator, which is illustrated in the plot diagram 202 of FIG. 2B. The Fourier analysis decomposes the optical signal (e.g., a signal as a function of time) into a spectrum of frequencies that make up that optical signal. The vertical axis of plot diagram 202 corresponds to power and the horizontal axis corresponds to the spectrum of frequencies. Thus, plot diagram 202 provides an illustration of power (e.g., energy per unit time) distribution as a function of frequency, and therefore provides a measure of how much the different frequencies contribute to the average power of the optical signal. A primary peak 204 is prominent in the power spectrum of the Fourier transform of an optical signal with proper DC bias selection, as illustrated in FIG. 2B.

Figure 3A:
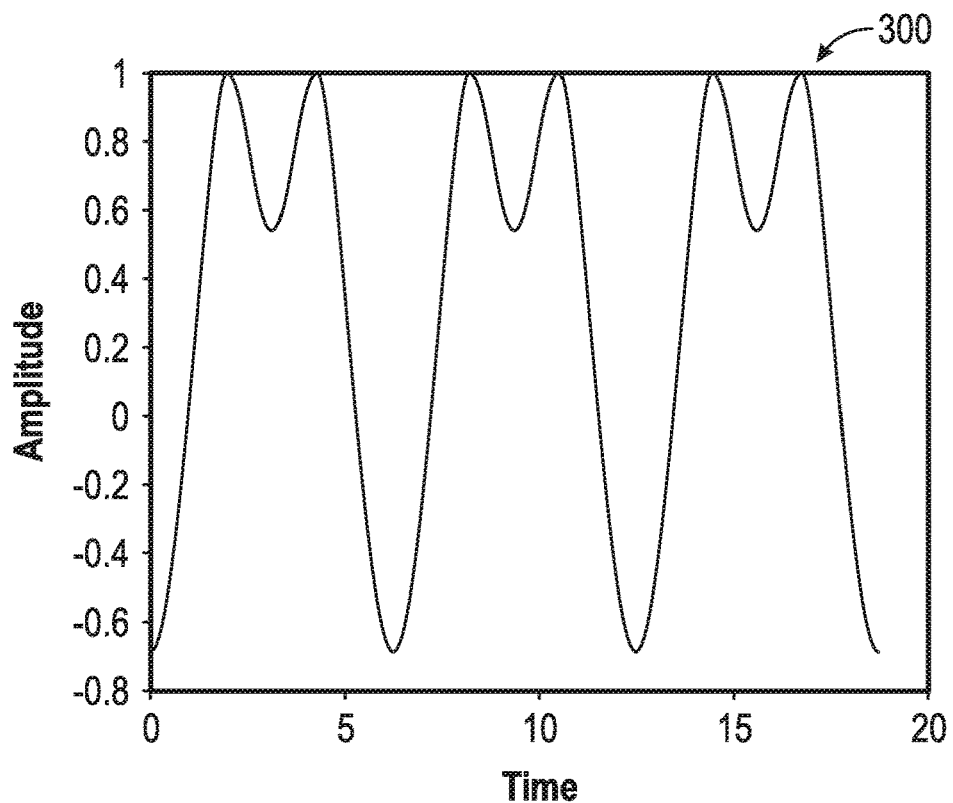
FIG. 3A is a plot diagram illustrating a waveform that represents signal output for an analog signal with improper DC bias selection, according to one or more example embodiments.

In contrast, the power spectrum of a Fourier transform for an optical signal with an improper DC bias selection (e.g., such as when the DC bias does not position the bias point at the quadrature point) will not show such a prominent primary peak. FIG. 3A is a plot diagram illustrating a waveform 300 that represents signal output from an optical intensity modulator (e.g., a MZ modulator) for an analog signal with improper DC bias selection. As shown, the waveform 300 plots amplitude as a function of time. The vertical axis of the plot corresponds to amplitude of the MZ modulator optical output and the horizontal axis corresponds to an arbitrary unit of time. However, due to the improper DC bias, the waveform 300 of the output signal is distorted and is no longer a pure sine wave in shape.

Figure 3B:
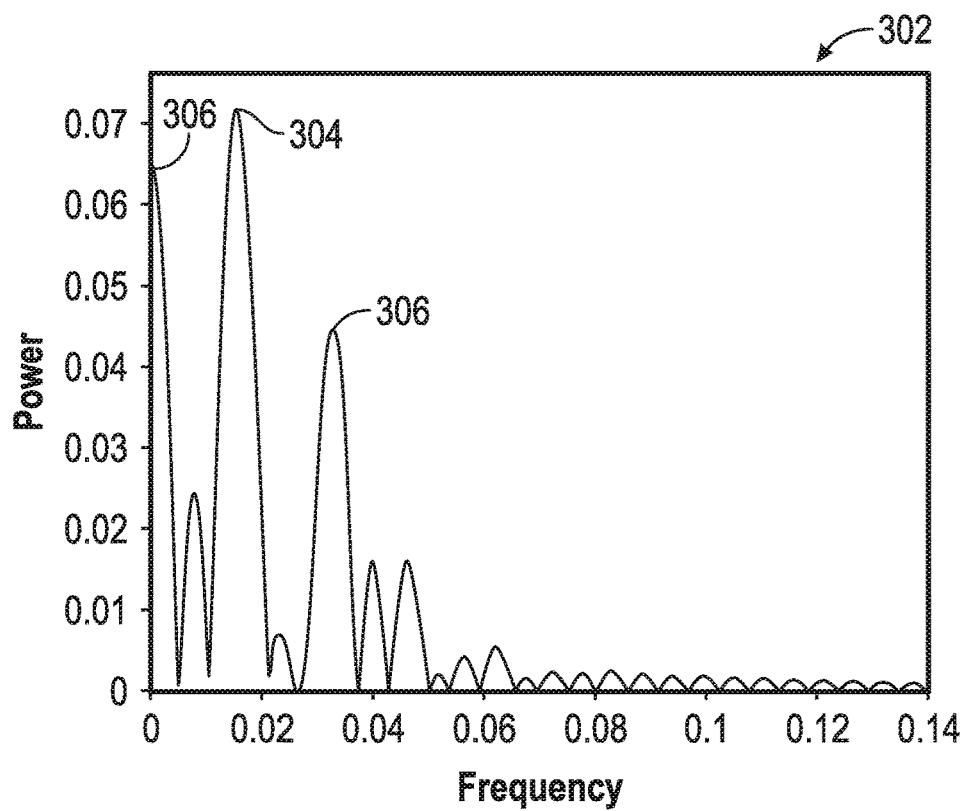
FIG. 3B is a plot diagram illustrating a power spectrum resulting from Fourier transforming an analog signal with improper DC bias selection, according to one or more example embodiments.

A Fourier transform can be applied to the optical signal output with improper DC bias from the MZ modulator, which is illustrated in the plot diagram 302 of FIG. 3B. The Fourier analysis decomposes the optical signal (e.g., a signal as a function of time) into a spectrum of frequencies that make up that optical signal. The vertical axis of plot diagram 302 corresponds to power and the horizontal axis corresponds to the spectrum of frequencies. Thus, plot diagram 302 provides an illustration of power (e.g., energy per unit time) distribution as a function of frequency, and therefore provides a measure of how much the different frequencies contribute to the average power of the optical signal. However, when the optical signal is distorted due to drift in the DC bias, harmonics 306 of the principal peak 304 become visible in the power spectrum of the Fourier transform, as illustrated in FIG. 3B. As the optical signal distorts due to DC bias drift, the power entering the harmonic peaks 306 generally increase.

The magnitude of the harmonic peaks 306 can be analyzed in real-time for adjusting the DC bias to minimize the harmonic peaks, thereby maintaining proper DC bias selection and linearity of the optical output signal. It is noted that in addition to the optical intensity modulation described herein, the monitoring of the harmonic distortion of signals can be extended to more complicated signals, such as quadrature amplitude modulation, pulse amplitude modulation, or orthogonal frequency division multiplexing by using the same premise. By monitoring harmonic distortion of the signals, and adjusting the DC bias to reduce the total harmonic distortion, linearity for analog systems can be maintained.

Figure 4A:
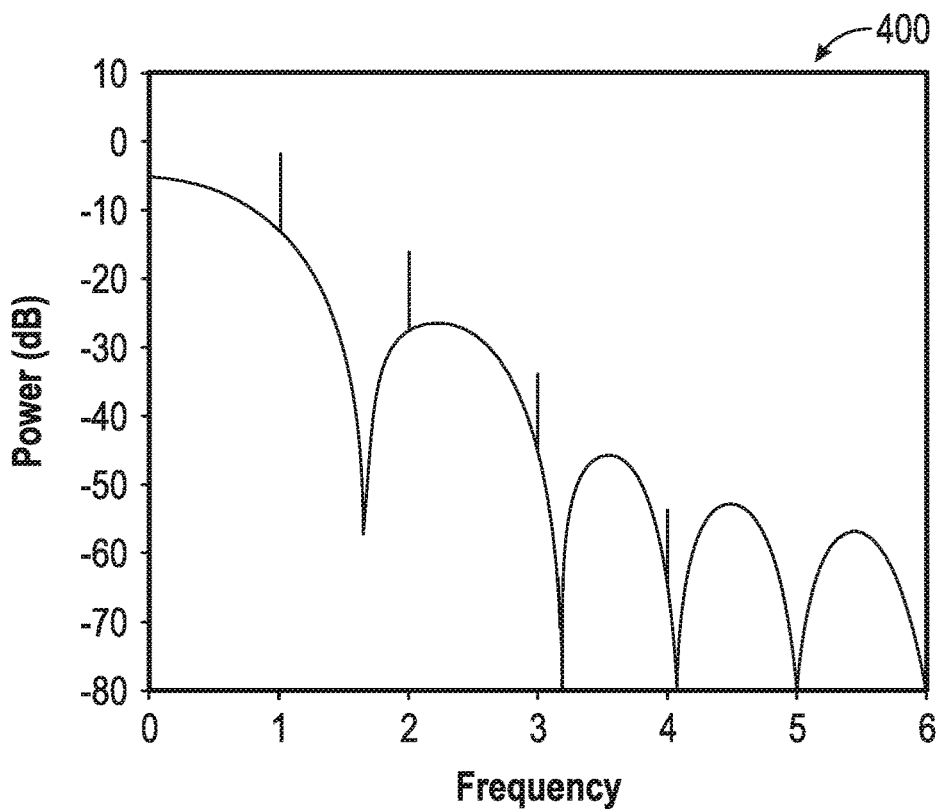
FIG. 4A is a plot diagram illustrating a power spectrum resulting from Fourier transforming of a digital signal with proper DC bias selection, according to one or more example embodiments.
Figure 4B:
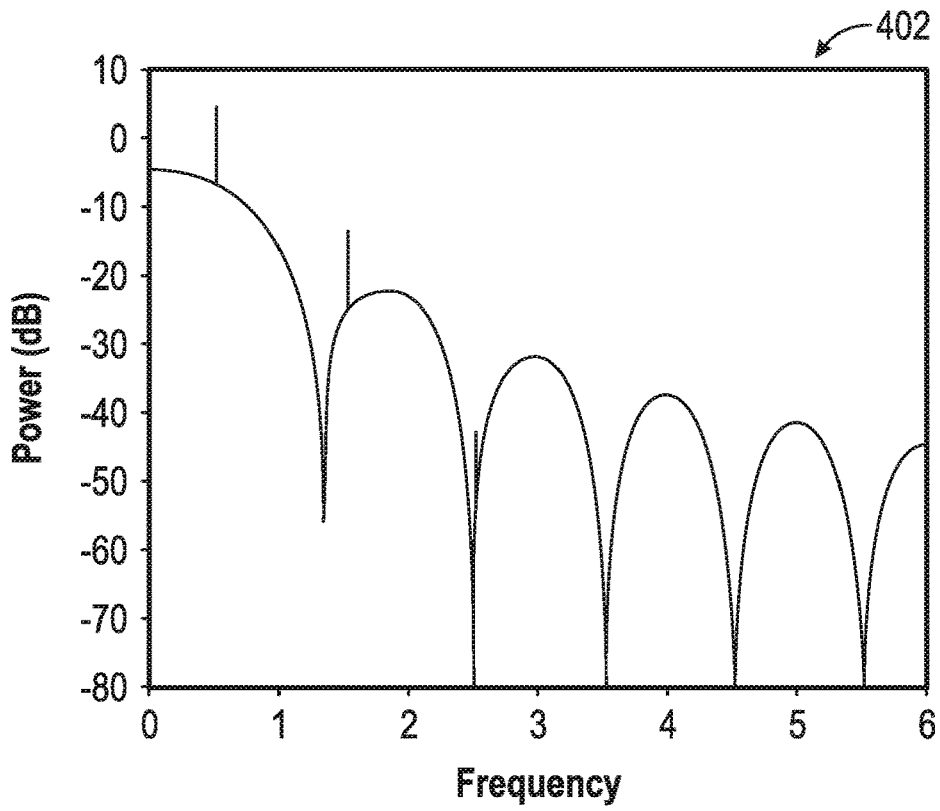
FIG. 4B is a plot diagram illustrating a power spectrum resulting from Fourier transforming of a digital signal with improper DC bias selection, according to one or more example embodiments.

The overall magnitudes of harmonics for a digital signal can also be analyzed for digital signals in a similar fashion to the examination of total harmonic distortion compared to the fundamental power spectrum for analog signals, as previously described in reference to FIGS. 2A-3B. For example, FIG. 4A is a plot diagram of a power spectrum 400 produced by Fourier transforming signal output having an on-off key modulation format with proper DC bias selection. FIG. 4B is a plot diagram of a power spectrum 402 produced by Fourier transforming signal output having an on-off key modulation format with improper DC bias selection (e.g., distortion due to DC bias drift). A comparison between FIGS. 4A and 4B shows that the peaks (and also the nulls) in the power spectrum 402 shift significantly relative to those of the power spectrum 400. Further, it can be observed that DC bias drift causes a reduction in the resolution between peaks in the power spectrum 402.

Figure 5:
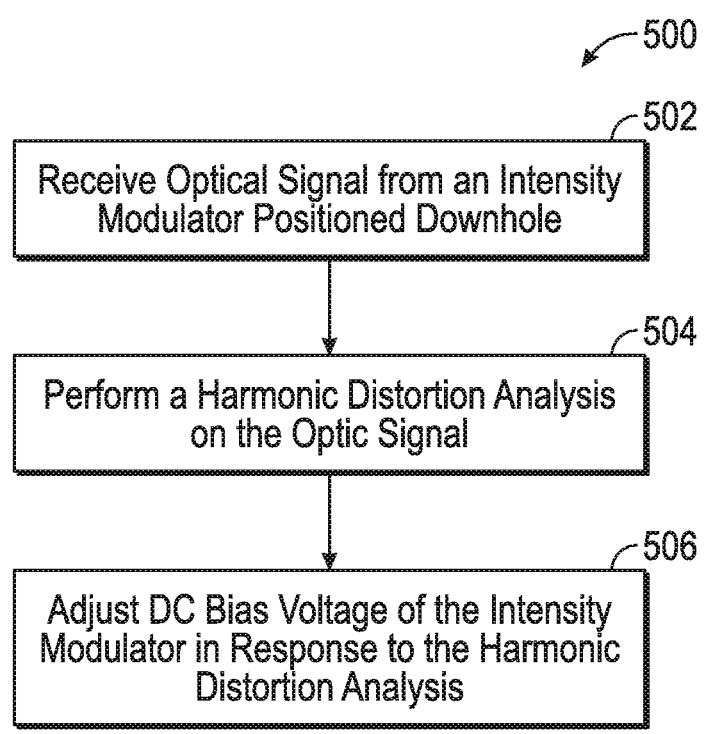
FIG. 5 is a flowchart of a method for DC bias control, according to one or more example embodiments.

FIG. 5 is a flowchart of an example method 500 for correcting DC bias in real-time by analyzing the distortion of the optical output signal from an optical modulator. At block 502, a receiver receives an optical signal from an intensity modulator positioned in a downhole environment. In at least one embodiment, the optical signal can either be analog or digital, and contains data which has been encoded onto light that has passed through the optical modulator.

At block 504, an analyzer performs a harmonic distortion analysis on the optical signal. In some embodiments, this includes applying a transform to the optical signal, which generates a power spectrum by decomposing the optical signal into a power distribution as a function of a spectrum of frequencies that comprise the optical signal. In some embodiments, the harmonic distortion analysis can be performed by analyzing the magnitude of harmonic peaks in the power spectrum. For example, distribution of power entering harmonics of the principle peak is indicative of drift in the DC bias, as discussed above in reference to FIGS. 2A-3B. Alternatively, in at least one embodiment, harmonic distortion analysis can be performed by analyzing changes in amplitude peaks or changes in resolution between amplitude peaks of the power spectrum, as discussed above in reference to FIGS. 4A and 4B. In at least one embodiment, the analyzer performs an analysis that indicates whether a power spectrum of the optical signal deviates from an expected power spectrum. Any of a variety of transforms could be used, for example, Fourier transforms, sine and cosine transforms, Hartley transforms, Hadamard transforms, wavelet transforms, or the like.

At block 506, a controller adjusts a direct current (DC) bias voltage of the intensity modulator in response to the harmonic distortion analysis indicating that the power spectrum of the optical signal deviates by a preselected amount from an expected power spectrum, as discussed above. In at least one embodiment, the expected power spectrum occurs when a bias point is positioned at a quadrature point of a sinusoid associated with the optical signal, as discussed above in reference to FIG. 1A. The DC bias voltage can be adjusted to reduce the magnitude of harmonic peaks in the power spectrum. In some embodiments, DC bias voltage adjustments can be achieved by shifting the DC bias voltage in a first direction in response to an increase in the magnitude of harmonic peaks and shifting the DC bias voltage in a second direction in response to a decrease in the magnitude of harmonic peaks. In some embodiments, dithers, pilot signals, averaging or cross-correlation analysis can be applied in combination with (or in replacement of) the harmonic analysis for DC bias control in downhole fiber optic telemetry systems. It is noted that in at least one embodiment, the optical signal can be transmitted to a DC bias controller positioned at a remote location prior to the harmonic distortion analysis of operation 504.

Figure 6:
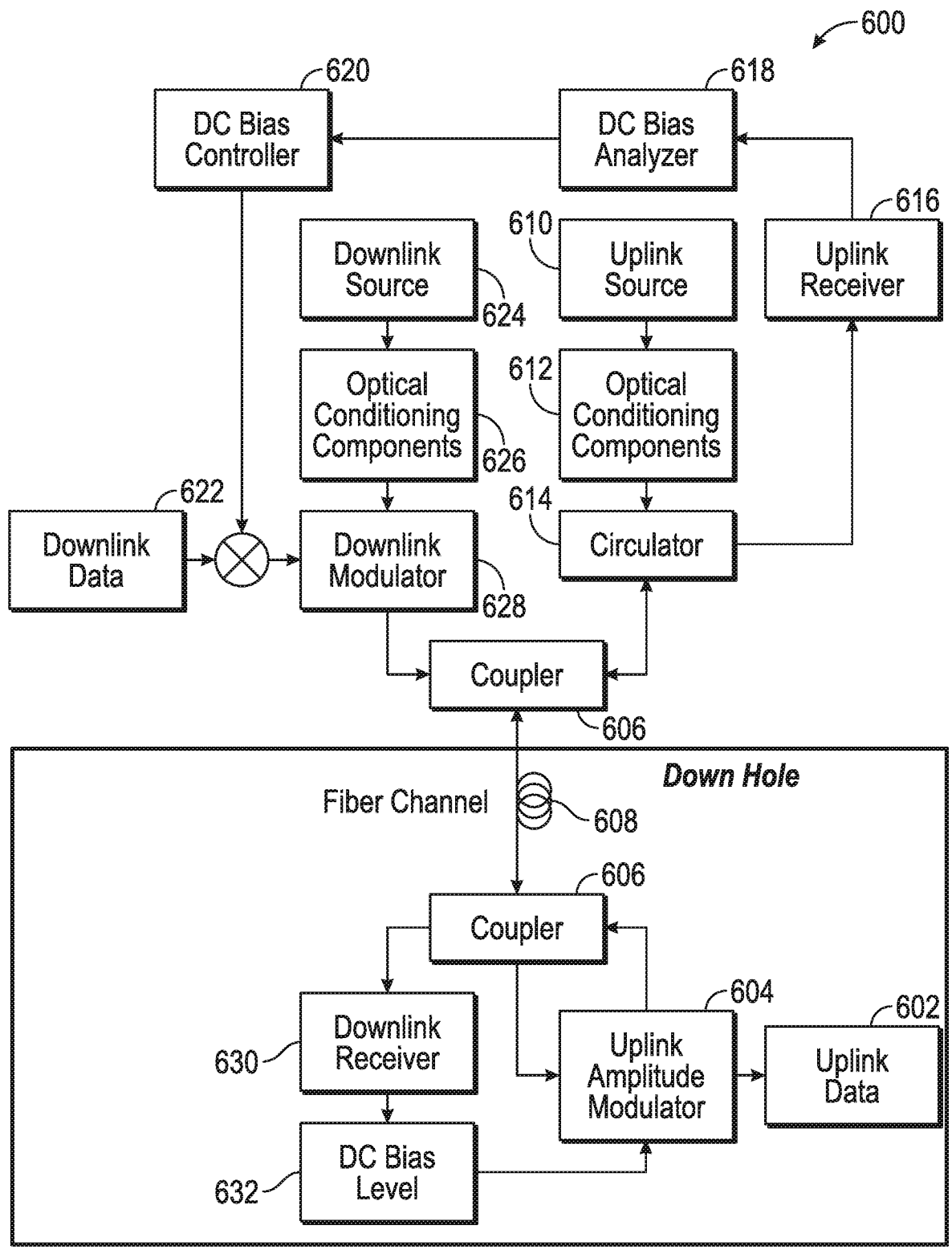
FIG. 6 is a diagram of an example system for implementing DC bias control, according to one or more example embodiments.

FIG. 6 is a diagram of an example system 600 for implementing DC bias control using remote feedback, according to one or more example embodiments. In this example, an uplink data signal 602 is modulated using uplink amplitude modulator 604 (e.g., a MZ modulator) before being communicated via couplers 606 and fiber channel 608 to a remote location (e.g., at a surface location and not downhole) for analyzing whether DC bias has drifted. In some examples, the fiber channel 608 can include optic fiber cables that are run downhole from the remote location.

Data in the uplink data signal 602 can be combined with signals originating at an uplink source 610 (e.g., laser or other light source) that pass through optical conditioning components 612 before being directed to an uplink receiver 616 by circulator 614. In some examples, the circulator 614 can further be configured to perform filtering functions. A DC bias analyzer 618 performs harmonic distortion analysis (such as previously described in reference to FIGS. 2A-5), the results of which can be interpreted by DC bias controller 620.

For example, if the DC bias analyzer 618 determines that a second harmonic is gaining in strength, the DC bias controller 620 can send a command to slightly shift the bias voltage in one direction. If the harmonic worsens, the DC bias controller 620 takes the feedback and then sends a command to shift the bias voltage in the opposite direction. In addition to this adaptive method, the DC bias controller 620 can send commands to apply a random small signal and choose a DC bias level with the least distortion. The sampling of the bias drift should be such that it measures changes of less than a fraction of the magnitude of the drift as the bias drifts at temperature with time, while simultaneously being less than the modulation frequency of the data stream (and therefore does not interfere with fidelity of the data stream).

The DC bias controller 620 can then send commands that are incorporated into a downlink data stream 622 for communication back downhole. Data in the downlink data stream 622 can be combined with signals originating at a downlink source 624 (e.g., laser or other light source) that pass through optical conditioning components 626 before being modulated using downlink modulator 628 and communicated downhole via couplers 606 and fiber channel 608 to a downlink receiver 630. The commands from the DC bias controller 620 can be parsed out at the downlink receiver 630 and executed to adjust the DC bias level 632, which connects back to the uplink amplitude modulator 604. In this manner, DC bias is controlled using a feedback mechanism that monitors the data signal itself to make adjustments to the DC bias voltage.

One of ordinary skill in the art will recognize that although the example of FIG. 6 is described for remote DC bias analysis and control, the DC bias analysis and control systems described herein can also be operated entirely downhole. For example, an integrated photodiode (or a coupler and external photodiode) can be used to measure a small percentage of light after the downhole, uplink amplitude modulator 604 before passing the data to a downhole DC bias analyzer and controller. Thus, distortion of the optical output signal can be analyzed and DC bias correct in real-time using the data signal itself via feedback mechanism and without requiring any additional data.

It is noted that, in some embodiments, dithers, pilot signals, averaging or cross-correlation analysis can be applied in combination with (or in replacement of) the harmonic analysis for DC bias control in downhole fiber optic telemetry systems. For example, dither signals can include applying a small amplitude signal $V_{AC}$ at a frequency lower than the data modulation frequency. The small amplitude signal $V_{AC}$ can be applied on the DC bias $V_{DC}$, yielding a total harmonic distortion (THD), as represented by equation (1) as follows:

$$THD = \frac{\sum_{n=2}^{\infty} P_{on}}{P_{o1}} 100 = \frac{\sum_{n=1}^{\infty} \left|J_{2n-1}\left(\frac{V_{AC}}{V_{\pi}}\pi\right)\right|}{\left|J_1\left(\frac{V_{AC}}{V_{\pi}}\pi\right)\right|} 100 + \frac{\sum_{n=1}^{\infty} \left|\cos\left(\frac{V_{DC}}{V_{\pi}}\pi\right)J_{2n}\left(\frac{V_{AC}}{V_{\pi}}\pi\right)\right|}{\left|\sin\left(\frac{V_{DC}}{V_{\pi}}\pi\right)J_1\left(\frac{V_{AC}}{V_{\pi}}\pi\right)\right|} 100 \tag{1}$$

where $J_k(x)$ represents the k-th order Bessel function. The total harmonic distortion (THD) can be minimized by adjusting the DC bias voltage $V_{DC}$.

In some embodiments, a known pilot signal can be transmitted every 1000 or 10,000 symbols. The amplitude and shape of the pilot signal is analyzed and the DC bias is adjusted until the pilot signal returns to an optimal amplitude and shape. This signal can also be compared to a previous pilot signal through cross-correlation. In other embodiments, averaging analysis can be performed by selecting data protocols that give a known average after a certain integration time. If this average goes high, it is indicative that the DC bias has drifted in one direction; if the average goes low, it is indicative that the DC bias has drifted in the other direction. For both high and low averages, the DC bias can be corrected through a remote command. It should be noted that the electronic feedback techniques described herein to control DC bias can also be extended to control the electrical amplitude of the signal and its DC offset. Thus, through harmonic analysis, the use of dithers, the use of pilot signals, and/or cross-correlation, the linearity of the system can be actively maintained.

In other embodiments, rather than using electronic feedback mechanisms for controlling drift in the DC bias due to temperature, physical designs of amplitude modulators can be employed for downhole fiber optic telemetry to reduce electrical and processing overhead.

Figure 7A:
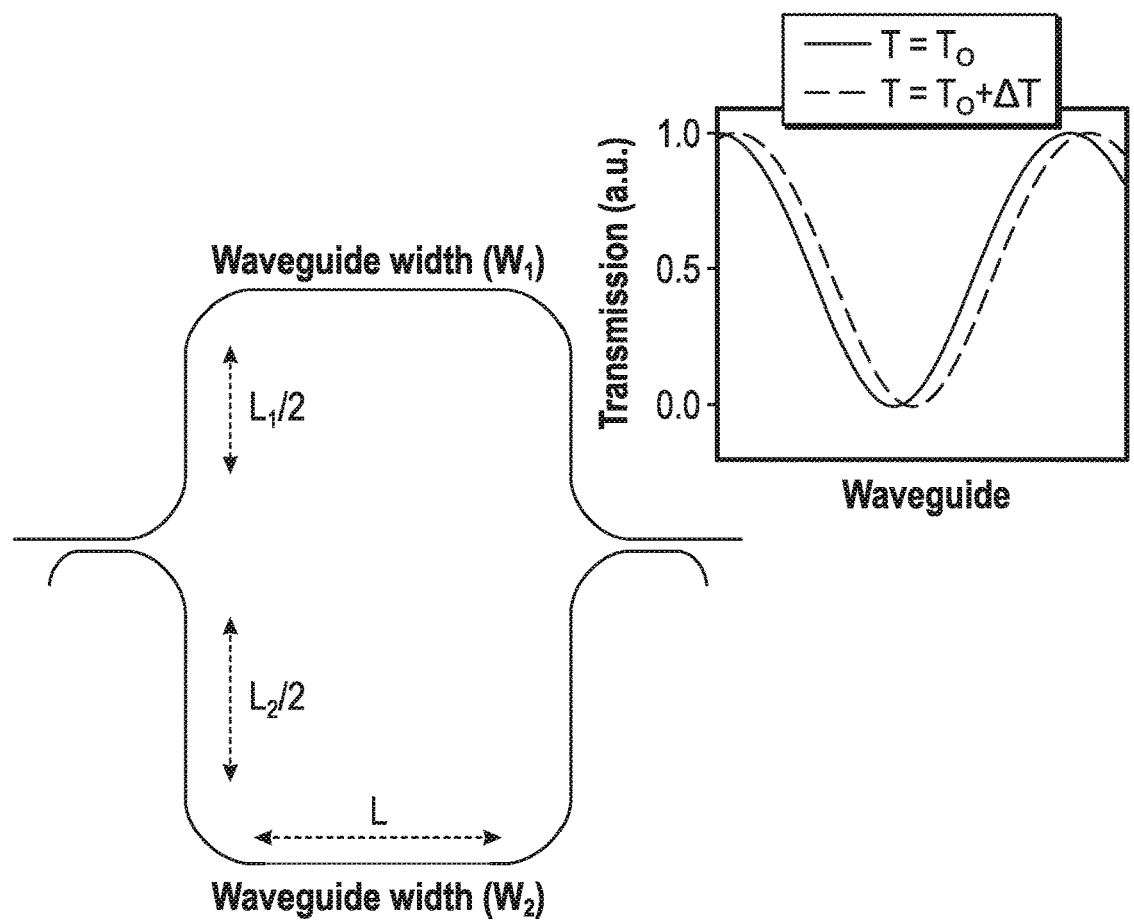
FIG. 7A is a schematic drawing of waveguide portions in a temperature insensitive Mach-Zehnder (MZ) modulator, according to one or more example embodiments.
Figure 7B:
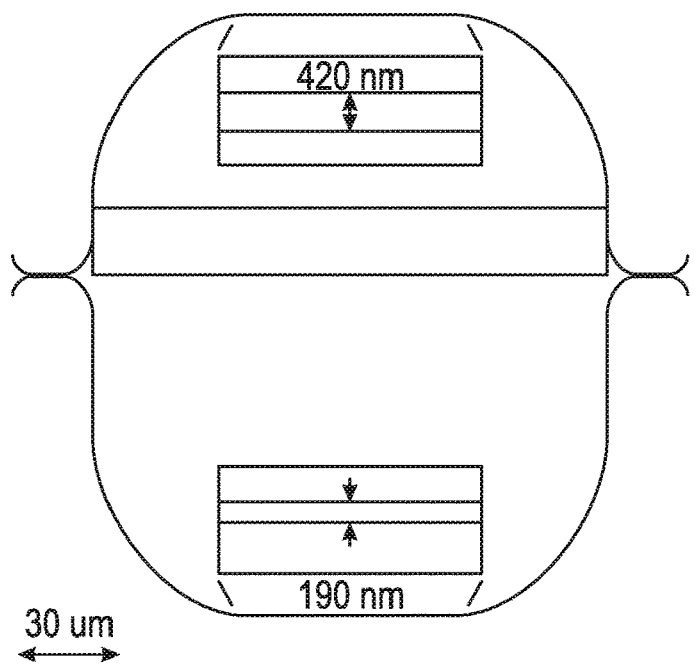
FIG. 7B is a schematic drawing of a waveguide design having different arm lengths and waveguide widths, according to one or more example embodiments.
Figure 7C:
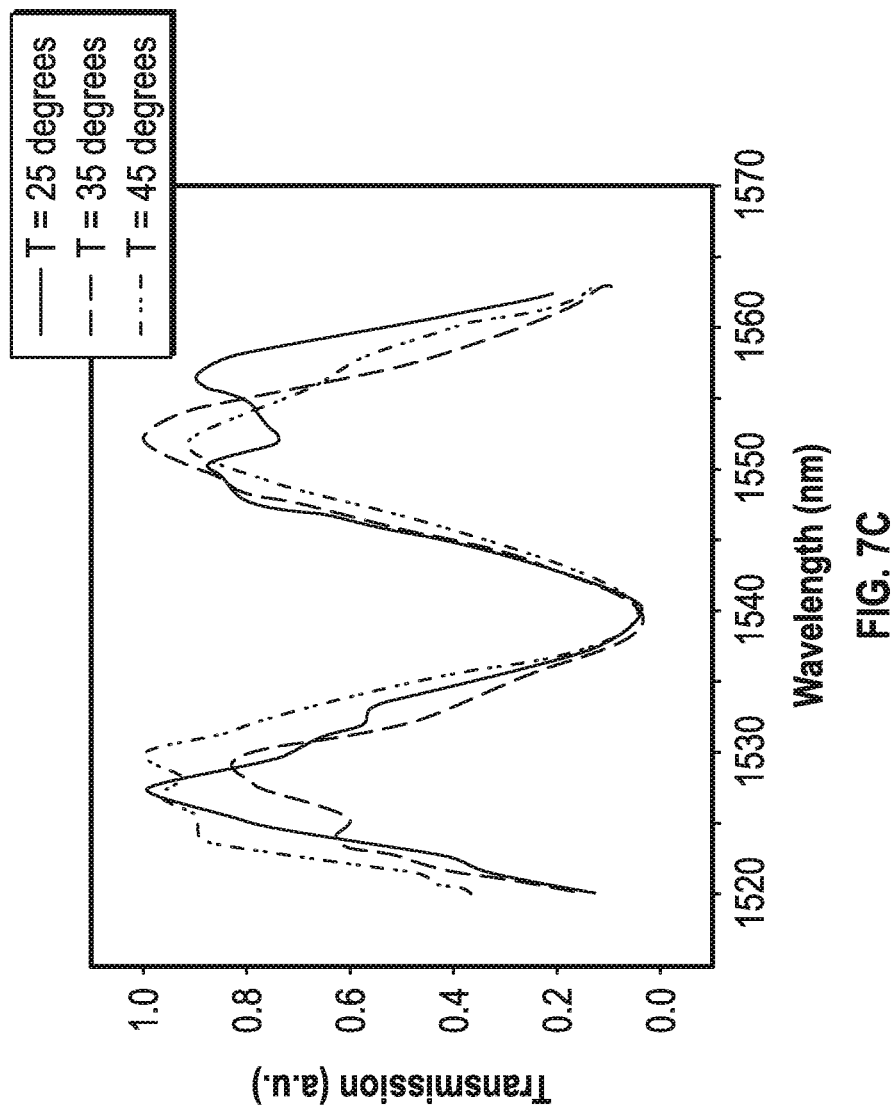
FIG. 7C is a plot diagram illustrating the effects of temperature variations in transmission, according to one or more example embodiments.

FIG. 7A is a schematic drawing of a design 700 of waveguide portions in a temperature insensitive MZ modulator. In design 700, the effects of thermal drift are countered by balancing the thickness of the waveguide (e.g., waveguide widths $W_1$ and $W_2$) and the length of each waveguide arm (e.g., arm lengths $L_1$ and $L_2$). As previously discussed, two waveguide arms are used in amplitude modulators to enable interference, and thereby generating power modulation. The waveguide thicknesses and lengths are selected such that differential thermal expansion between the two waveguide arms balance each other out. For example, FIG. 7B is a schematic drawing of a waveguide design having different arm lengths and waveguide widths (e.g., 420 nm and 190 nm for waveguide widths $W_1$ and $W_2$, respectively). Further, as illustrated in the plot diagram of FIG. 7C, temperature does not affect transmission. In the plot of FIG. 7C, the vertical axis corresponds to a measure of transmission in arbitrary units and the horizontal axis corresponds to wavelength of light in nanometers (nm).

With the configuration of design 700, the temperature sensitivity of any spectrum minimum ($\lambda_0$) can represented by equation (2) as follows:

$$\frac{\Delta \lambda_0}{\Delta T} = \frac{\Delta L \cdot \frac{\partial n_{eff}}{\partial T} + L \cdot \frac{\partial (\Delta n_{eff})}{\partial T}}{M} \quad (2)$$

Where $\Delta L = L_2 - L_1$ are the differences in arm length, M is the mass, and $\Delta n_{eff} = n_{eff}(W_2) - n_{eff}(W_1)$ is the difference in effective index of refraction.

Figure 8:
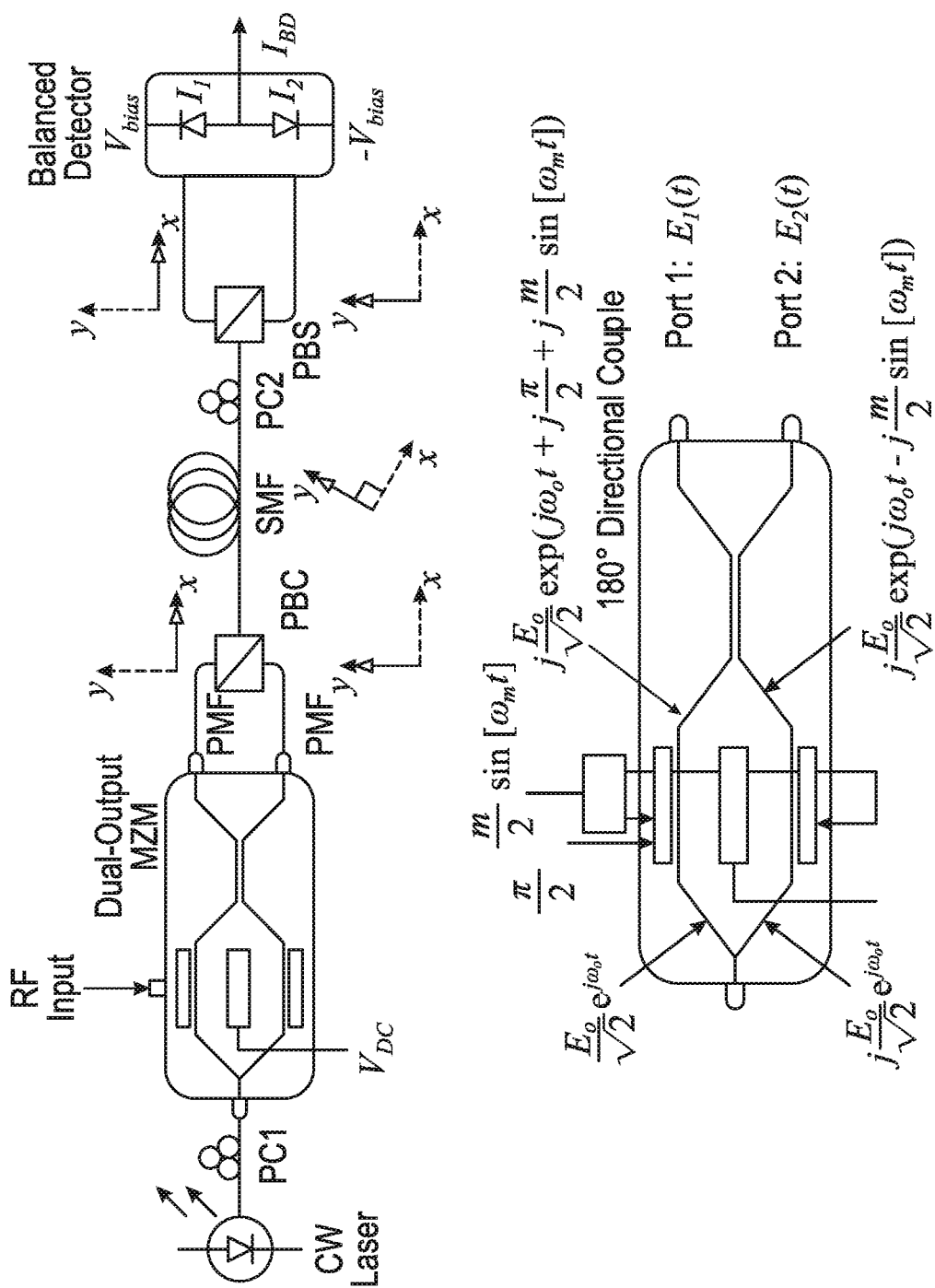
FIG. 8 is a schematic drawing of a design of a dual-output MZ modulator, according to one or more example embodiments.

FIG. 8 is a schematic drawing of a design 800 of a dual-output MZ modulator that is also insensitive to temperature, wherein the modulated light is referenced back to itself. After being modulated, the light is passed through an integrated 2×2 coupler (labeled in FIG. 8 as the 180° directional coupler). This allows half (e.g., 50%) of the light in each branch to exit on each output. The output then carries exactly complimentary amplitude information. Therefore, if one leg of the modulated portion of the device receives an additional phase shift due to temperature, the signal on one of the output legs would increase, while the signal on the other output leg would decrease by the exact same amount. By using a balanced detector, the change in signal due to differential changes in arm path length caused by temperature is canceled out while the common modulated signal is allowed through. It is noted that the design 800 illustrated in FIG. 8 provides equations for the electric fields at each leg of the amplitude modulator. Thus, DC bias drift with temperature can be countered through physical design.

Example Machine Architecture and
Machine-Readable Medium

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (Salas). For example, at least some of the operations may be performed by a group of computers (as examples of machines including processors), with these operations being accessible via a network (e.g., the Internet) and via one or more appropriate interfaces (e.g., Application Program Interfaces (APIs).)

Figure 9:
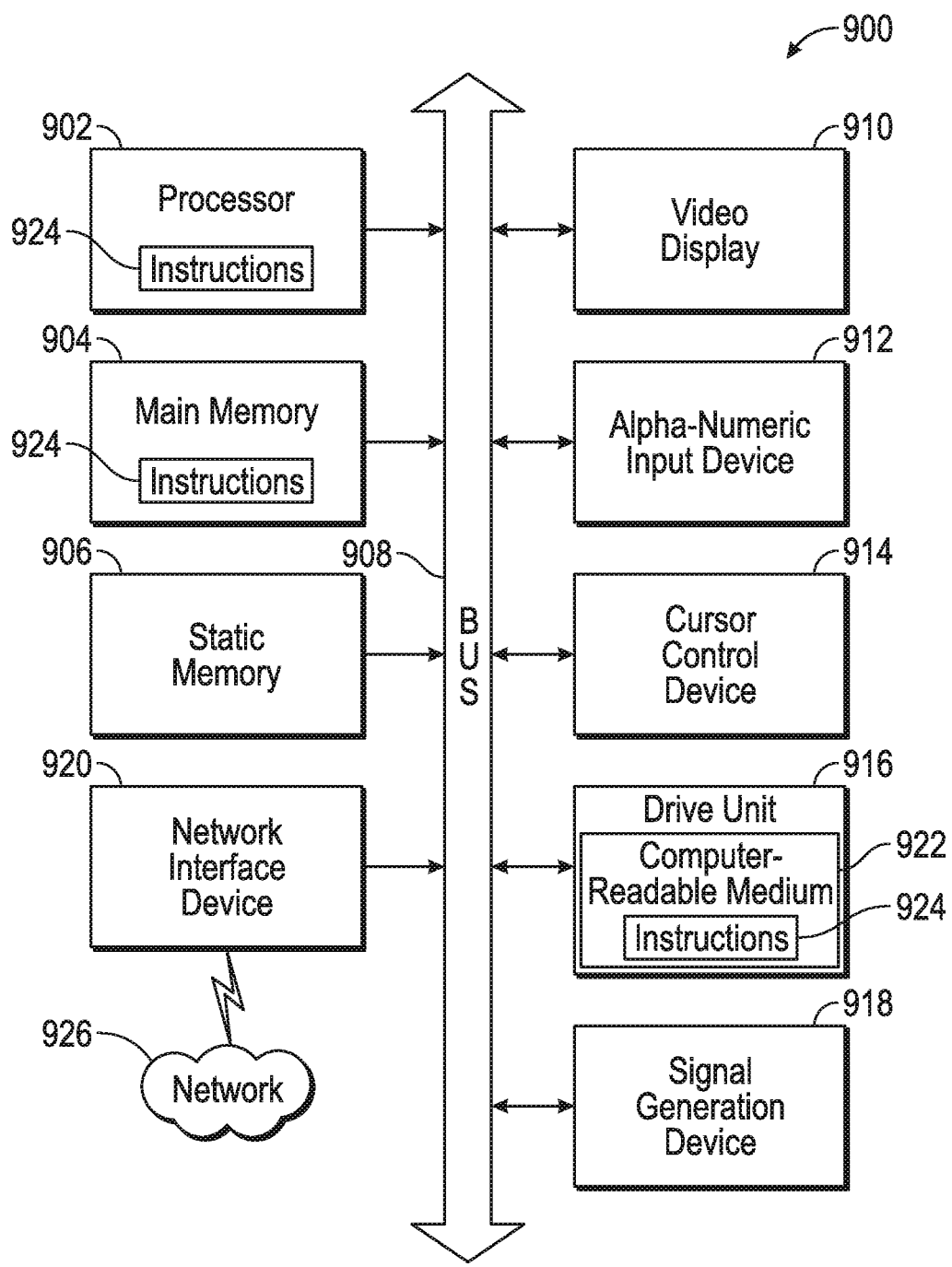
FIG. 9 is a diagrammatic representation of a machine in the example form of a computer system within which a set of instructions may be executed for causing the machine to perform any one or more of the methodologies discussed herein, according to one or more example embodiments.

FIG. 9 is a diagrammatic representation of a machine in the example form of a computer system 900 within which a set of instructions 924 may be executed for causing the machine to perform any one or more of the methodologies discussed herein. For example, the DC bias analyzer 618 and DC bias controller 620 (FIG. 6) or any one or more of its components may be provided by the system 900.

In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 900 includes a processor 902 (e.g., a central processing unit (CPU) a graphics processing unit (GPU) or both), a main memory 904 and a static memory 906, which communicate with each other via a bus 908. The computer system 900 may further include a video display unit 910 (e.g., a liquid crystal display (LCD) or a cathode ray tube (CRT)). The computer system 900 also includes an alpha-numeric input device 912 (e.g., a keyboard), a cursor control device 914 (e.g., a mouse), a disk drive unit 916, a signal generation device 918 (e.g., a microphone/speaker) and a network interface device 920.

The disk drive unit 916 includes a machine-readable or computer-readable storage medium 922 on which is stored one or more sets of instructions 924 (e.g., software) embodying any one or more of the methodologies or functions described herein. The instructions 924 may also reside, completely or at least partially, within the main memory 904 and/or within the processor 902 during execution thereof by the computer system 900, the main memory 904 and the processor 902 also constituting non-transitory machine-readable media. The instructions 924 may further be transmitted or received over a network 926 via the network interface device 920.

While the machine-readable storage medium 922 is shown in an example embodiment to be a single medium, the term "machine-readable medium" should be taken to include a single medium or multiple media (e.g., a centralized or distributed database and/or associated caches and servers) that store the one or more sets of instructions 924. The term "machine-readable medium" shall also be taken to include any medium that is capable of storing a set of instructions for execution by the machine and that cause the machine to perform any one or more of the methodologies of this disclosure. The term "machine-readable medium" shall accordingly be taken to include, but not be limited to, solid-state memory devices of all types, as well as optical and magnetic media.

Although this disclosure has been described with reference to specific example embodiments, it will be evident that various modifications and changes may be made to these embodiments without departing from the broader scope of the disclosure. Accordingly, the specification and drawings are to be regarded in an illustrative rather than a restrictive sense.

The following numbered examples are illustrative embodiments in accordance with various aspects of the present disclosure.

1. A method, including: receiving an optical signal from an intensity modulator positioned in a downhole environment; performing a harmonic distortion analysis on the optical signal; and adjusting a direct current (DC) bias voltage of the intensity modulator in response to the harmonic distortion analysis indicating that a power spectrum of the optical signal deviates by a preselected amount from an expected power spectrum, in which the expected power spectrum occurs when a bias point is positioned at a quadrature point of a sinusoid associated with the optical signal.

2. The method of example 1, in which performing the harmonic distortion analysis further includes applying a Fourier transform to the optical signal.

3. The method of any of examples 1-2, further including: generating the power spectrum by decomposing the optical signal into a power distribution as a function of a spectrum of frequencies that include the optical signal.

4. The method of any of examples 1-3, in which performing the harmonic distortion analysis further includes analyzing the magnitude of harmonic peaks in the power spectrum.

5. The method of any of examples 1-4, in which adjusting the DC bias voltage further includes reducing the magnitude of harmonic peaks in the power spectrum.

6. The method of any of examples 1-5, in which adjusting the DC bias voltage further includes: shifting the DC bias voltage in a first direction in response to an increase in the magnitude of harmonic peaks; and shifting the DC bias voltage in a second direction in response to a decrease in the magnitude of harmonic peaks.

7. The method of any of examples 1-6, in which performing the harmonic distortion analysis further includes analyzing changes in amplitude peaks of the power spectrum.

8. The method of any of examples 1-7, in which performing the harmonic distortion analysis further includes analyzing changes in resolution between amplitude peaks of the power spectrum.

9. The method of any of examples 1-8, further including: transmitting the optical signal to a DC bias controller positioned at a remote location for harmonic distortion analysis.

10. The method of any of examples 1-9, further including: applying at least one of a dither, a pilot signal, an averaging analysis, and a cross-correlation analysis to the optical signal.

11. A system, including: an amplitude modulator to encode data onto an optical signal; a DC bias analyzer to perform harmonic distortion analysis on the optical signal for determining whether a power spectrum of the optical signal deviates by a preselected amount from an expected power spectrum, in which the expected power spectrum occurs when a bias point is positioned at a quadrature point of a sinusoid associated with the optical signal; and a DC bias controller to send commands for adjusting a DC bias voltage of the amplitude modulator.

12. The system of example 11, in which the DC bias controller is configured to send commands in response to the DC bias analyzer determining that the power spectrum of the optical signal deviates by the preselected amount from an expected power spectrum.

13. The system of any of the preceding examples, in which the DC bias analyzer is configured to apply a Fourier transform to the optical signal and generate the power spectrum by decomposing the optical signal into a power distribution as a function of a spectrum of frequencies that include the optical signal.

14. The system of any of the preceding examples, in which the DC bias analyzer is configured to analyze the magnitude of harmonic peaks in the power spectrum.

15. The system of any of the preceding examples, in which the DC bias analyzer and the DC bias controller are positioned at a location remote from the amplitude modulator.

16. A computer readable storage medium having stored thereon instructions for causing a machine, in response to execution of the instructions by the machine, to perform operations including: receiving an optical signal from an intensity modulator positioned in a downhole environment; performing a harmonic distortion analysis on the optical signal; and adjusting a direct current (DC) bias voltage of the intensity modulator in response to the harmonic distortion analysis indicating that a power spectrum of the optical signal deviates by a preselected amount from an expected power spectrum, in which the expected power spectrum occurs when a bias point is positioned at a quadrature point of a sinusoid associated with the optical signal.

17. The computer readable storage medium of example 16, in which the instructions are executable to further perform operations including: generating the power spectrum by decomposing the optical signal into a power distribution as a function of a spectrum of frequencies that comprise the optical signal.

18. The computer readable storage medium of any of the preceding examples, in which the instructions are executable to further perform operations including: shifting the DC bias voltage in a first direction in response to an increase in the magnitude of harmonic peaks in the power spectrum; and shifting the DC bias voltage in a second direction in response to a decrease in the magnitude of harmonic peaks in the power spectrum.

19. The computer readable storage medium of any of the preceding examples, in which the instructions are executable to further perform operations including: analyzing changes in amplitude peaks of the power spectrum.

20. The computer readable storage medium of any of the preceding examples, in which the instructions are executable to further perform operations including: analyzing changes in resolution between amplitude peaks of the power spectrum.

In this description, references to "one embodiment" or "an embodiment," or to "one example" or "an example," are not intended necessarily to refer to the same embodiment or example; however, neither are such embodiments mutually exclusive, unless so stated or as will be readily apparent to those of ordinary skill in the art having the benefit of this disclosure. Thus, a variety of combinations and/or integrations of the embodiments and examples described herein may be included, as well as further embodiments and examples as defined within the scope of all claims based on this disclosure, and all legal equivalents of such claims.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, disclosed subject matter lies in less than all features of a single disclosed embodiment. Thus, the following claims are hereby incorporated into the Detailed Description, with each claim standing on its own as a separate embodiment.

What is claimed is:

1. A method, comprising:
receiving an optical signal from an intensity modulator positioned in a downhole environment;
performing a harmonic distortion analysis on the optical signal; and
adjusting a direct current (DC) bias voltage of the intensity modulator in response to the harmonic distortion analysis indicating that a power spectrum of the optical signal deviates by a preselected amount from an expected power spectrum, wherein the expected power spectrum occurs when a bias point is positioned at a quadrature point of a sinusoid associated with the optical signal.

2. The method of claim 1, wherein performing the harmonic distortion analysis further comprises applying a Fourier transform to the optical signal.

3. The method of claim 1, further comprising:
generating the power spectrum by decomposing the optical signal into a power distribution as a function of a spectrum of frequencies that comprise the optical signal.

4. The method of claim 1, wherein performing the harmonic distortion analysis further comprises analyzing the magnitude of harmonic peaks in the power spectrum.

5. The method of claim 4, wherein adjusting the DC bias voltage further comprises reducing the magnitude of harmonic peaks in the power spectrum.

6. The method of claim 4, wherein adjusting the DC bias voltage further comprises: shifting the DC bias voltage in a first direction in response to an increase in the magnitude of harmonic peaks; and shifting the DC bias voltage in a second direction in response to a decrease in the magnitude of harmonic peaks.

7. The method of claim 1, wherein performing the harmonic distortion analysis further comprises analyzing changes in amplitude peaks of the power spectrum.

8. The method of claim 1, wherein performing the harmonic distortion analysis further comprises analyzing changes in resolution between amplitude peaks of the power spectrum.

9. The method of claim 1, further comprising:
transmitting the optical signal to a DC bias controller positioned at a remote location for harmonic distortion analysis.

10. The method of claim 1, further comprising:
applying at least one of a dither, a pilot signal, an averaging analysis, and a cross-correlation analysis to the optical signal.

11. A system, comprising:
an amplitude modulator to encode data onto an optical signal;
a DC bias analyzer to perform harmonic distortion analysis on the optical signal for determining whether a power spectrum of the optical signal deviates by a preselected amount from an expected power spectrum, wherein the expected power spectrum occurs when a bias point is positioned at a quadrature point of a sinusoid associated with the optical signal; and
a DC bias controller to send commands for adjusting a DC bias voltage of the amplitude modulator.

12. The system of claim 11, wherein the DC bias controller is configured to send commands in response to the DC bias analyzer determining that that the power spectrum of the optical signal deviates by the preselected amount from an expected power spectrum.

13. The system of claim 11, wherein the DC bias analyzer is configured to apply a Fourier transform to the optical signal and generate the power spectrum by decomposing the optical signal into a power distribution as a function of a spectrum of frequencies that comprise the optical signal.

14. The system of claim 11, wherein the DC bias analyzer is configured to analyze the magnitude of harmonic peaks in the power spectrum.

15. The system of claim 11, wherein the DC bias analyzer and the DC bias controller are positioned at a location remote from the amplitude modulator.

16. A computer readable storage medium having stored thereon instructions for causing a machine, in response to execution of the instructions by the machine, to perform operations comprising:
receiving an optical signal from an intensity modulator positioned in a downhole environment;
performing a harmonic distortion analysis on the optical signal; and
adjusting a direct current (DC) bias voltage of the intensity modulator in response to the harmonic distortion analysis indicating that a power spectrum of the optical signal deviates by a preselected amount from an expected power spectrum, wherein the expected power spectrum occurs when a bias point is positioned at a quadrature point of a sinusoid associated with the optical signal.

17. The computer readable storage medium of claim 16, wherein the instructions are executable to further perform operations comprising:
generating the power spectrum by decomposing the optical signal into a power distribution as a function of a spectrum of frequencies that comprise the optical signal.

18. The computer readable storage medium of claim 16, wherein the instructions are executable to further perform operations comprising:
shifting the DC bias voltage in a first direction in response to an increase in the magnitude of harmonic peaks in the power spectrum; and shifting the DC bias voltage in a second direction in response to a decrease in the magnitude of harmonic peaks in the power spectrum.

19. The computer readable storage medium of claim 16, wherein the instructions are executable to further perform operations comprising:
analyzing changes in amplitude peaks of the power spectrum.

20. The computer readable storage medium of claim 16, wherein the instructions are executable to further perform operations comprising:
analyzing changes in resolution between amplitude peaks of the power spectrum.

* * * * *